(12) United States Patent
Sasaki (10) Patent No.: US 11,450,828 B2
(45) Date of Patent: Sep. 20, 2022

(54) DISPLAY DEVICE

(71) Applicant: Japan Display Inc., Tokyo (JP)

(72) Inventor: Tohru Sasaki, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 89 days.

(21) Appl. No.: 17/124,519

(22) Filed: Dec. 17, 2020

(65) Prior Publication Data

US 2021/0193944 A1    Jun. 24, 2021

(30) Foreign Application Priority Data

Dec. 19, 2019 (JP) .............................. JP2019-229036

(51) Int. Cl.
*H01L 51/50* (2006.01)
*H01L 27/32* (2006.01)

(52) U.S. Cl.
CPC ........ *H01L 51/5044* (2013.01); *H01L 27/322* (2013.01); *H01L 51/5088* (2013.01); *H01L 51/5096* (2013.01)

(58) Field of Classification Search
CPC combination set(s) only.
See application file for complete search history.

(56) References Cited

U.S. PATENT DOCUMENTS

| 2016/0118449 A1 | 4/2016 | Sato et al. |
| 2016/0155785 A1 | 6/2016 | Sato |
| 2018/0294424 A1* | 10/2018 | Toyoda .................. H01L 51/56 |

FOREIGN PATENT DOCUMENTS

| JP | 2008-243559 A | 10/2008 |
| JP | 2016-85913 A | 5/2016 |
| JP | 2016-103395 A | 6/2016 |

* cited by examiner

*Primary Examiner* — Moin M Rahman
*Assistant Examiner* — Mohammad A Rahman
(74) *Attorney, Agent, or Firm* — Xsensus LLP (57) ABSTRACT

A display device comprising: pixel electrodes; an electroluminescent layer composed of layers laminated with each other, the multiple layers including a light-emitting layer and a charge generation layer; and a counter electrode. The multiple layers include a first layer composed of sections separated from each other and overlapping with the pixel electrodes, a second layer in contact with the first layer and continuous over the pixel electrodes, and a third layer interposed between the first layer and the second layer, the third layer being in contact with the first layer and the second layer over an adjacent pair of the sections. At least the charge generation layer is the first layer. The second layer is adapted to inject or transport carriers, either electrons or holes. The third layer is adapted to block the carriers injected or transported by the second layer.

13 Claims, 7 Drawing Sheets

DISPLAY DEVICE

CROSS-REFERENCE TO RELATED APPLICATION

The present application claims priority from Japanese patent application JP2019-229036 filed on Dec. 19, 2019, the contents of which are hereby incorporated by reference into this application.

BACKGROUND

1. Field

This relates to a display device.

2. Description of the Related Art

A display device has pixels, which has come to be closer next to each other due to increase of the number thereof. An organic electroluminescent display may have a continuous layer (e.g., hole transport layer) all over the pixels, whereby adjacent light-emitting layers emit light by a lateral leakage current transmitted through the continuous layer (JP2016-103395A and JP2016-85913A).

In a structure in which some light-emitting layers for different emission colors overlap to generate white light and a color filter is combined to display a color image, a charge generation layer is disposed between the upper and lower light-emitting layers. Easiness of current flow in the charge generation layer problematizes the lateral leakage current described above.

JP2008-243559A discloses that a hole transport layer is formed in pieces. Likewise, the charge generation layer can be formed in pieces, but continuous layers over and under the charge generation layer problematizes the lateral leakage current through these layers.

SUMMARY

This aims at reducing a lateral leakage current.

A display device comprises: a plurality of pixel electrodes; an electroluminescent layer composed of multiple layers laminated with each other, the multiple layers including a light-emitting layer and a charge generation layer; and a counter electrode. The multiple layers include a first layer composed of some sections separated from each other and overlapping with the plurality of pixel electrodes, a second layer in contact with the first layer and continuous over the plurality of pixel electrodes, and a third layer interposed between the first layer and the second layer, the third layer being in contact with the first layer and the second layer over an adjacent pair of the sections. At least the charge generation layer is the first layer. The second layer is adapted to inject or transport carriers, either electrons or holes. The third layer is adapted to block the carriers injected or transported by the second layer.

The third layer is adapted to block carriers injected or transported by the second layer, thereby reducing a lateral leakage current.

DETAILED DESCRIPTION

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

[First Embodiment]

Figure 1:
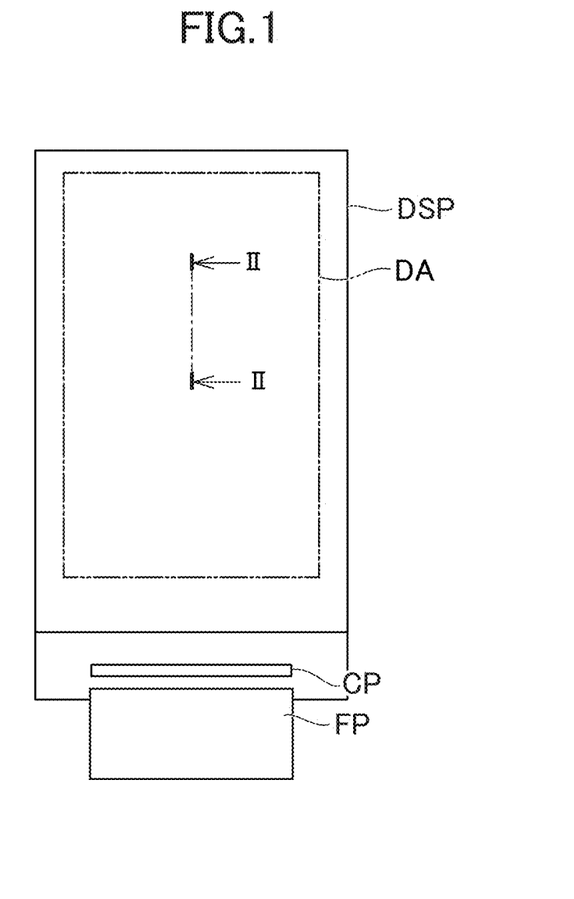
FIG. 1 is a plan view of a display device in a first embodiment.

FIG. 1 is a plan view of a display device in a first embodiment. The display device includes a display DSP. The display DSP is flexible and is foldable outside a display area DA. An integrated circuit chip CP for driving elements for displaying images is mounted on the display DSP. A flexible printed circuit board FP is connected to the display DSP.

The display device is, for example, an organic electroluminescent display device. The display device has the display area DA in which an image is displayed. In the display area DA, for example, unit pixels (sub-pixels) in colors consisting of red, green, and blue are combined to form a full-color pixel, and a full-color image is displayed.

Figure 2:
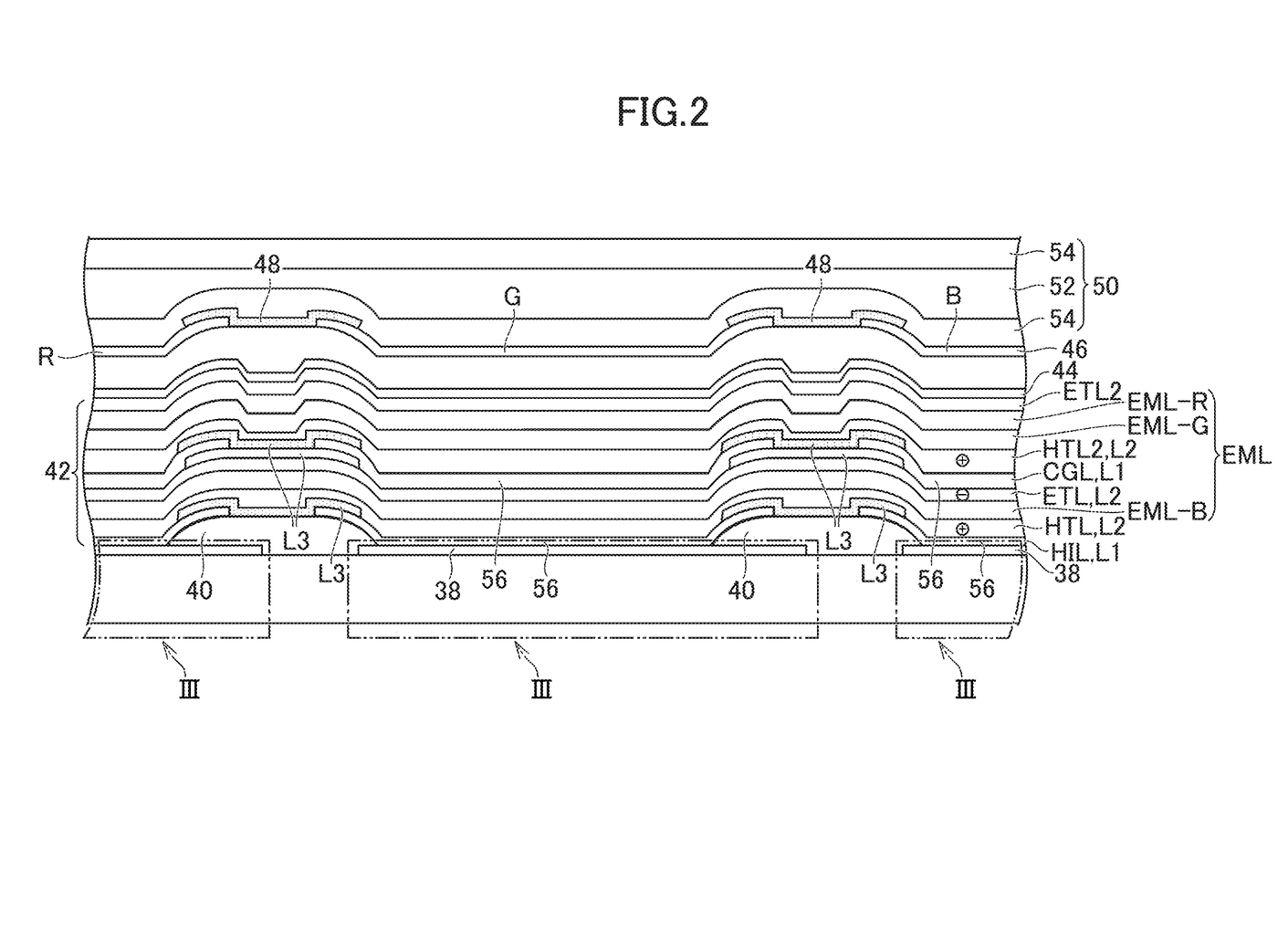
FIG. 2 is a II-II cross-sectional view of the display device in FIG. 1.
Figure 3:
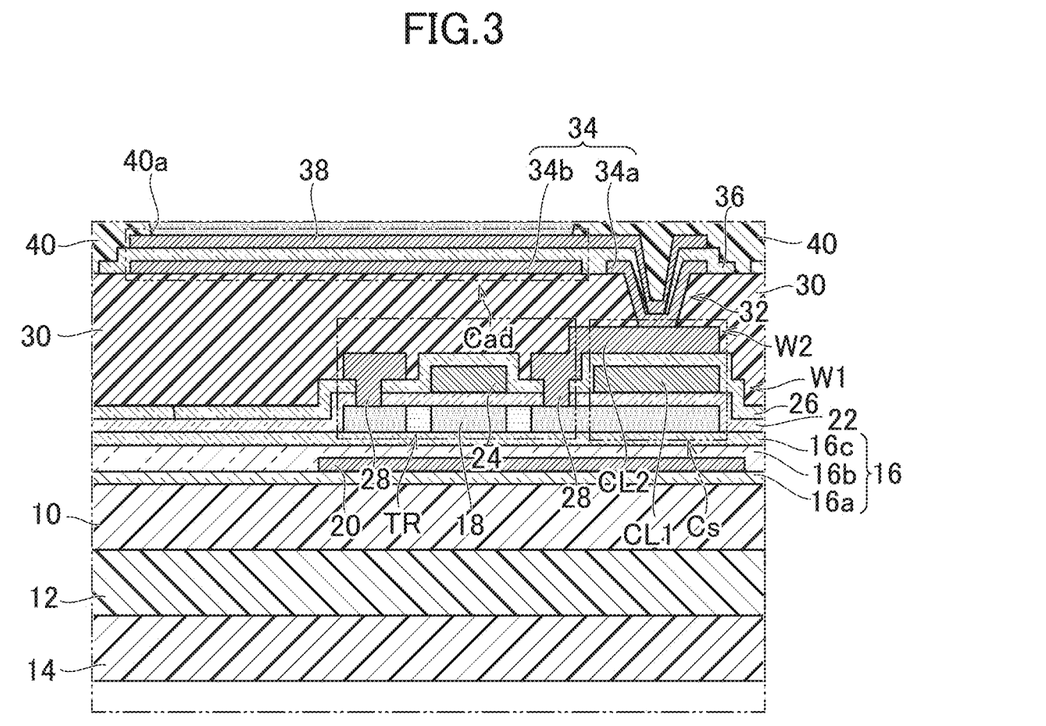
FIG. 3 is an enlarged view of a portion III in FIG. 2.

FIG. 2 is a II-II cross-sectional view of the display device in FIG. 1. FIG. 3 is an enlarged view of a portion III in FIG. 2. A resin substrate 10 in FIG. 3 is made of polyimide. However, any other resin material may be used if it is a base material having sufficient flexibility for forming a sheet display or a flexible display. A reinforcing film 14 is adhered to the back surface of the resin substrate 10 via a pressure-sensitive adhesive 12.

On the resin substrate 10, a barrier inorganic film 16 (undercoat layer) is laminated. The barrier inorganic film 16 has a three-layer laminated structure of a first inorganic film (e.g., a silicon oxide film) 16*a*, a second inorganic film (e.g., a silicon nitride film) 16*b*, and a third inorganic film (e.g., a silicon oxide film) 16*c*. The first inorganic film 16*a* in the lowermost layer is for improving adhesion to the resin substrate 10, the second inorganic film 16*b* in the middle layer is a block film of moisture and impurities from the outside, and the third inorganic film 16*c* in the uppermost layer is a block film for preventing hydrogen atoms contained in the second inorganic film 16*b* from diffusing to the semiconductor layer 18 side of the thin film transistor TR, but the structure is not limited thereto, and there may be a further laminated layer, or a single layer or a double layer laminate is applicable.

An additional film 20 may be formed in accordance with a place where the thin film transistor TR is formed. The additional film 20 can suppress change in characteristics of the thin film transistor TR caused by intrusion of light from the back surface of the channel, or can provide a predetermined potential by being formed with a conductive material to give a back-gate effect to the thin film transistor TR. Here, after forming the first inorganic film 16a, the additional film 20 is formed in an island shape in accordance with the place where the thin film transistor TR is formed, and then the second inorganic film 16b and the third inorganic film 16c are laminated, so that the additional film 20 is sealed in the barrier inorganic film 16, but modification is possible, and the additional film 20 may be first formed on the resin substrate 10 and then the barrier inorganic film 16 may be formed.

The thin film transistor TR is formed on the barrier inorganic film 16. A polysilicon thin film transistor is exemplified here, and only an N-channel transistor is shown, but a P-channel transistor may be formed at the same time. The semiconductor layer 18 of the thin film transistor TR has a structure in which a low concentration impurity region or an intrinsic semiconductor region is provided between a channel region and a source/drain region. A silicon oxide film is used here as a gate insulating film 22. A gate electrode 24 is part of a first wiring layer W1 formed of MoW. The first wiring layer W1, in addition to the gate electrode 24, has a first holding capacitance line CL1. Between the first holding capacitance line CL1 and the semiconductor layer 18 (source/drain region), via the gate insulating film 22, a portion of the holding capacitance Cs is formed.

On the gate electrode 24, an interlayer insulating film 26 (silicon oxide film or silicon nitride film) is laminated. On the interlayer insulating film 26, a second wiring layer W2 with its portion serving as the source/drain electrode 28 is formed. Here, a three-layer laminated structure of Ti, Al, and Ti is employed. Through the interlayer insulating film 26, the first holding capacitance line CL1 (part of the first wiring layer W1) and the second holding capacitance line CL2 (part of the second wiring layer W2) constitute another part of the holding capacitance Cs.

A planarization organic film 30 is provided to cover the source/drain electrodes 28. Due to superiority in flatness compared to inorganic insulating materials formed by chemical vapor deposition, resins such as photosensitive acrylics are used for the planarization organic film 30.

The planarization organic film 30 is removed at a pixel contact portion 32, and an indium tin oxide (ITO) film 34 is formed thereon. The indium tin oxide film 34 includes a first transparent conductive film 34a and a second transparent conductive film 34b separated from each other.

The second wiring layer W2, with its surface exposed by the removal of the planarization organic film 30, is covered with the first transparent conductive film 34a. An inorganic insulating film (silicon nitride film) 36 is provided on the planarizing organic film 30 to cover the first transparent conductive film 34a. The inorganic insulating film (e.g., silicon nitride film) 36 is open to the pixel contact portion 32; the pixel electrode 38 is laminated, allowing conductivity to the source/drain electrode 28 through the opening. The pixel electrode 38 is formed as a reflective electrode, having a three-layer laminated structure of an indium zinc oxide film, an Ag film, and an indium zinc oxide film. Here, an indium tin oxide film may be used instead of the indium zinc oxide film. The pixel electrode 38 extends laterally from the pixel contact portion 32 to above the thin film transistor TR.

The second transparent conductive film 34b is adjacent to the pixel contact portion 32 and is disposed below the pixel electrode 38 (further below the inorganic insulating film 36). The second transparent conductive film 34b, the inorganic insulating film 36, and the pixel electrode 38 overlap with each other, thereby forming an additional capacitance Cad.

The display device has an insulating layer 40 covering an end of each pixel electrode 38. The insulating layer 40 is also referred to as a bank (lib). The insulating layer 40 is formed on the planarization organic film 30, for example, above the pixel contact portion 32 as a partition wall of the adjacent pixel regions. For the insulating layer 40, photosensitive acrylic is used just like the planarizing organic film 30. The insulating layer 40 has an opening 40a to expose a surface of the pixel electrode 38 as a light-emitting region. An end of the opening 40a should have a gently tapered shape. The end of the opening 40a in an acute angle shape results in poor coverage of the electroluminescent layer 42 formed thereon.

The planarizing organic film 30 and the insulating layer 40 are in contact with each other through an opening in the inorganic insulating film 36 between them. As a result, moisture and gas which are desorbed from the planarization organic film 30 can be extracted through the insulating layer 40 during heat treatment after the formation of the insulating layer 40.

As shown in FIG. 2, on the plurality of pixel electrodes 38, the electroluminescent layer 42 is laminated. The electroluminescent layer 42 includes multiple layers. The multiple layers include a light-emitting layer EML. The light-emitting layer EML includes some stacked light-emitting layers EML (for example, a light-emitting layer EML-B for a blue emission color, a light-emitting layer EML-R for a red emission color, and a light-emitting layer EML-G for a green emission color). The light-emitting layers EML overlap with each other, and white light is generated by color mixing.

Two or more light-emitting layers EML (red light-emitting layer EML-R, green light-emitting layer EML-G) have low energy barriers, and thus they are in contact with and overlap with each other. On the other hand, a charge generation layer CGL is interposed between the red and green light-emitting layers EML-R, EML-G and the blue light-emitting layer EML-B.

A hole injection layer HIL is on and in contact with the pixel electrode 38. A hole transport layer HTL is on and in contact with the hole injection layer HIL. The hole transport layer HTL may vary in thickness, depending on its light color to be extracted (color of the color layers R, G, or B described later). In the example of FIG. 2, the lowermost light-emitting layer EML (blue light-emitting layer EML-B) is on and in contact with the hole transport layer HTL.

An electron transport layer ETL is on and in contact with the lowermost light-emitting layer EML (blue light-emitting layer EML-B). A hole block layer (not shown) for preventing inflow of holes may be laminated on the electron transport layer ETL. The charge generation layer CGL is on and in contact with the electron transport layer ETL (or an unillustrated hole block layer thereon). A second hole transport layer HTL2 is on and in contact with the charge generation layer CGL. The green light-emitting layer EML-G described above is on and in contact with the second hole transport layer HTL2. The red light-emitting layer EML-R is on and in contact with the green light-emitting layer EML-G.

A second electron transport layer ETL2 is on and in contact with the uppermost light-emitting layer EML (red light-emitting layer EML-R). A counter-electrode 44 is on and in contact with the second electron transport layer ETL2. An electron injection layer (not shown) for promoting electron injection from the counter electrode 44 may be interposed between the second electron transport layer ETL2 and the counter electrode 44. The example of FIG. 2 has a top emission structure, and therefore the counter electrode 44 is transparent. For example, an Mg layer and an Ag layer are formed as a thin film enough to pass the emitted light from the electroluminescent layer 42. In the present embodiment, the pixel electrode 38 is an anode, the counter electrode 44 is a cathode. A light-emitting element is constituted by the plurality of pixel electrodes 38, a counter electrode 44, and an electroluminescent layer 42 interposed between a central portion of each pixel electrode 38 and the counter electrode 44.

The display device has a color filter layer 46. The color filter layer 46 is separated into color layers R, G, B for some colors (e.g., red, green, and blue). Each color layer R, G, B passes light of a specific wavelength in the white light to form a color pixel. A black matrix layer 48 is disposed between adjacent color layers R, G, B of different colors.

A sealing layer 50 is formed on the counter electrode 44. The sealing layer 50 has a function of preventing moisture from entering the electroluminescent layer 42 from the outside, and is required to have a high gas barrier property. The sealing layer 50 has a laminated structure of a pair of inorganic films 54 (e.g., silicon nitride films) sandwiching an organic film 52 from above and below, respectively. The pair of inorganic films 54 overlap with each other around the organic film 52 and are in contact with each other. An unillustrated protective layer and a polarizing plate (e.g., circular polarizing plate) may be laminated on the sealing layer 50.

Figure 4:
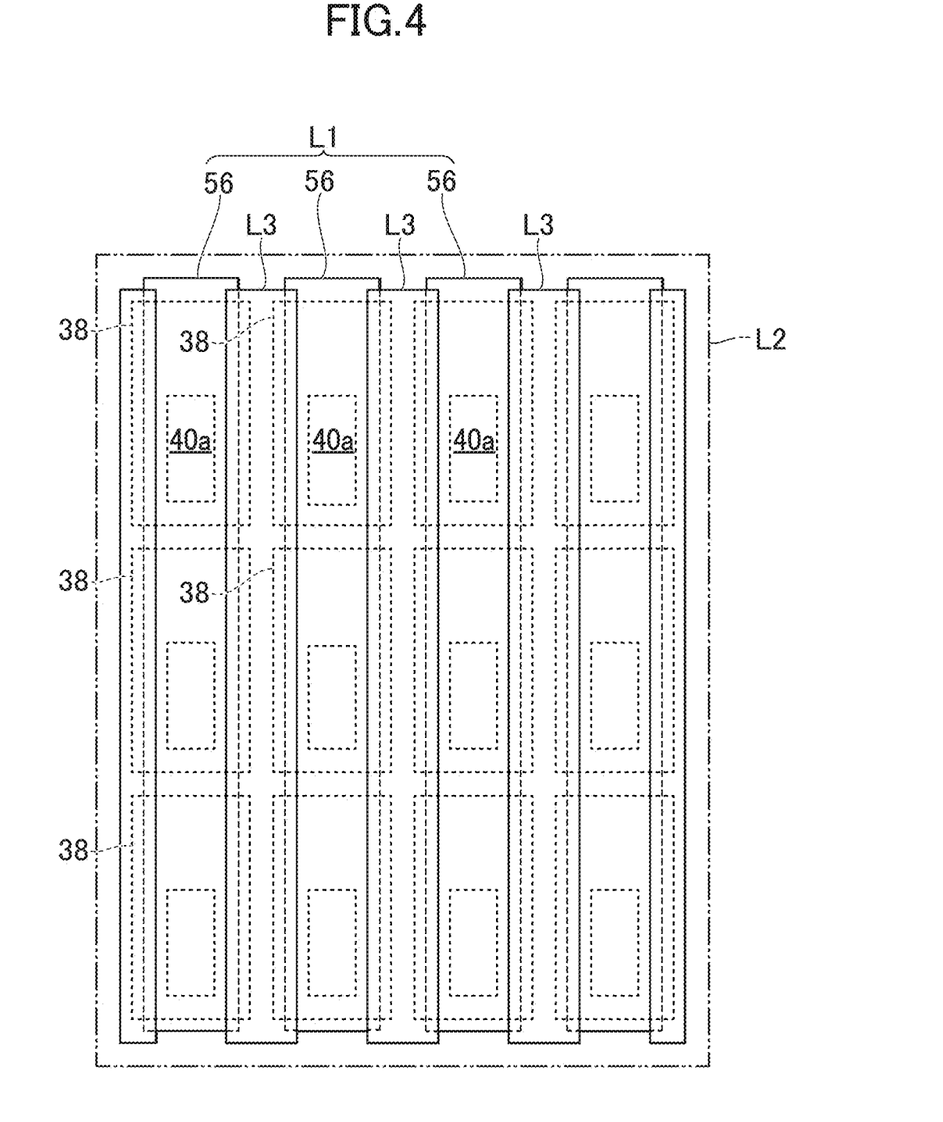
FIG. 4 is a plan view of multiple layers of an electroluminescent layer.

FIG. 4 is a plan view of multiple layers of the electroluminescent layer 42.

[Layer 1]

The multiple layers include a first layer L1. The first layer L1 is separated between two adjacent pixels emitting light in different colors. The first layer L1 may be continuous between two adjacent pixels emitting light in the same color. The first layer L1 is composed of some sections 56 separated from each other. The sections 56 overlap with the plurality of pixel electrodes 38. In the example of FIG. 4, each section 56 overlaps with a row of pixel electrodes 38. Alternatively, each section 56 may overlap with a corresponding one of the pixel electrodes 38.

As shown in FIG. 2, some first layers L1 overlap with each other. For example, at least the charge generation layer CGL is the first layer L1. The hole injection layer HIL is also the first layer L1. Each of the first layers L1 is made of a material with high transportability of carriers, either electrons or holes. The first layer L1 that is the hole injection layer HIL is made of a material with high transportability of holes. The first layer L1 that is the charge generation layer CGL may be formed of a material with high transportability of either electronics or holes.

[Layer 2]

As shown in FIG. 4, the multiple layers include a second layer L2. The second layer L2 is in contact with the first layer L1 and is continuous over the plurality of pixel electrodes 38.

The second layer L2 is above and/or below the first layer L1. As shown in FIG. 2, some second layers L2 are laminated. For example, each of the hole transport layer HTL and the electron transport layer ETL is the second layer. The second layer L2 has characteristics of injecting or transporting carriers, either electrons or holes.

For example, the hole transport layer HTL (second layer L2) overlaps with the hole injection layer HIL (first layer L1) from above. With both being in contact with each other, holes move from the hole injection layer HIL to the hole transport layer HTL.

A pair of second layers L2 (second hole transport layer HTL2, electron transport layer ETL) are in contact with the first layer L1 (charge generation layer CGL) from above and below, respectively. Specifically, the second hole transport layer HTL2 (second layer L2) overlaps with the charge generation layer CGL (first layer L1) from above. With both being in contact with each other, holes move from the charge generation layer CGL to the second hole transport layer HTL2. Further, the second layer L2, that is an electron transport layer ETL (or unillustrated hole block layer thereon), overlaps with the charge generation layer CGL (first layer L1) from below. With both being in contact with each other, electrons move from the charge generation layer CGL.

[Layer 3]

As described above, the first layer L1 is separated between two adjacent pixels emitting light in different colors, therefore preventing direct flow of carriers into the adjacent sections 56. However, the carriers flow through the continuous layer (second layer L2) in contact with it from above or from below. Therefore, in the present embodiment, the multiple layers of the electroluminescent layer 42 include a third layer L3.

Each of the third layers L3 is interposed between a corresponding one of the first layers L1 and a corresponding one of the second layers L2. The third layer L3 is in contact with them over an adjacent pair of the sections 56 of the first layer L1. The third layer L3 overlaps with each of the ends of the pair of adjacent sections 56. The third layer L3 is located only in the region overlapping with the insulating layer 40. The third layer L3 is provided in a region overlapping with a black matrix layer 48.

The third layer L3 has characteristics of blocking carriers injected or transported by the second layer L2. In addition, the third layer L3 may be formed of a material capable of blocking the carriers that the corresponding first layer L1 has high transportability of.

For example, the third layer L3 is interposed between the hole injection layer HIL (first layer L1) and the hole transport layer HTL (second layer L2). This third layer L3 is a hole block layer made of a material capable of blocking the holes (holes transported by the second layer L2) that the hole transport layer HTL has high transportability of.

A pair of third layers L3 are in contact with the first layer L1 (charge generation layer CGL) from above and below, respectively. Specifically, the third layer L3 is interposed between the charge generation layer CGL (first layer L1) and the second hole transport layer HTL2 (second layer L2). This third layer L3 is a hole block layer made of a material capable of blocking the holes that the second hole transport layer HTL2 has high transportability of.

Another third layer L3 is interposed between the charge generation layer CGL (first layer L1) and the electron transport layer ETL (second layer L2). This third layer L3 is an electron block layer made of a material capable of blocking the electrons that the electron transport layer ETL has a high transporting property of.

According to the present embodiment, the third layer L3 is adapted to block carriers injected or transported by the second layer L2. Specifically, the third layer L3 overlaps with the end of the section 56, thereby preventing the shortest movement of carriers between the adjacent sections 56. Thus, despite movement of the carriers, the moving distance is made longer and the lateral leakage current is made lower.

[Second Embodiment]

Figure 5:
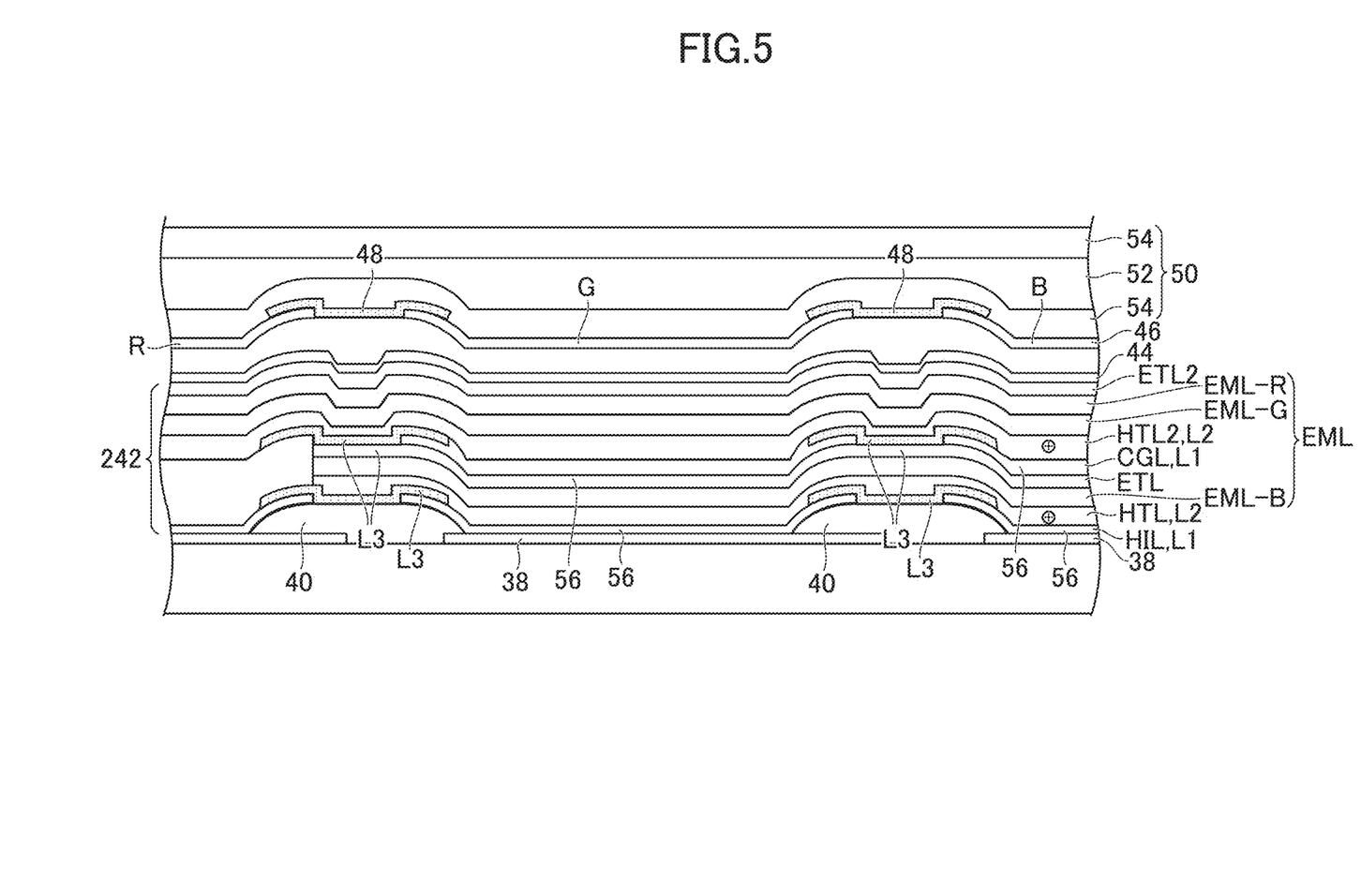
FIG. 5 is a cross-sectional view of a display device in a second embodiment.

FIG. 5 is a cross-sectional view of a display device in a second embodiment. In the present embodiment, the third layer L3 in the first embodiment under the charge generation layer CGL (first layer L1) is omitted. The charge generation layer CGL is made of a material with high transportability of holes.

The electroluminescent layer 242 includes some first layers L1 (hole injection layer HIL, charge generation layer CGL) and some second layers L2 (hole transport layer HTL, second hole transport layer HTL2). A third layer L3 is interposed between the hole injection layer HIL (first layer L1) and the hole transport layer HTL (second layer L2). This third layer L3 may be made of a material capable of blocking the holes that the hole transport layer HTL has high transportability of, whereas the material may have high transportability of electrons.

Another third layer L3 is interposed between the charge generation layer CGL (first layer L1) and the second hole transport layer HTL2 (second layer L2). This third layer L3 is made of a material capable of blocking the holes that the second hole transport layer HTL2 has high transportability of, whereas the material may have high transportability of electrons. What is explained in the first embodiment is applicable hereto.

[Third Embodiment]

Figure 6:
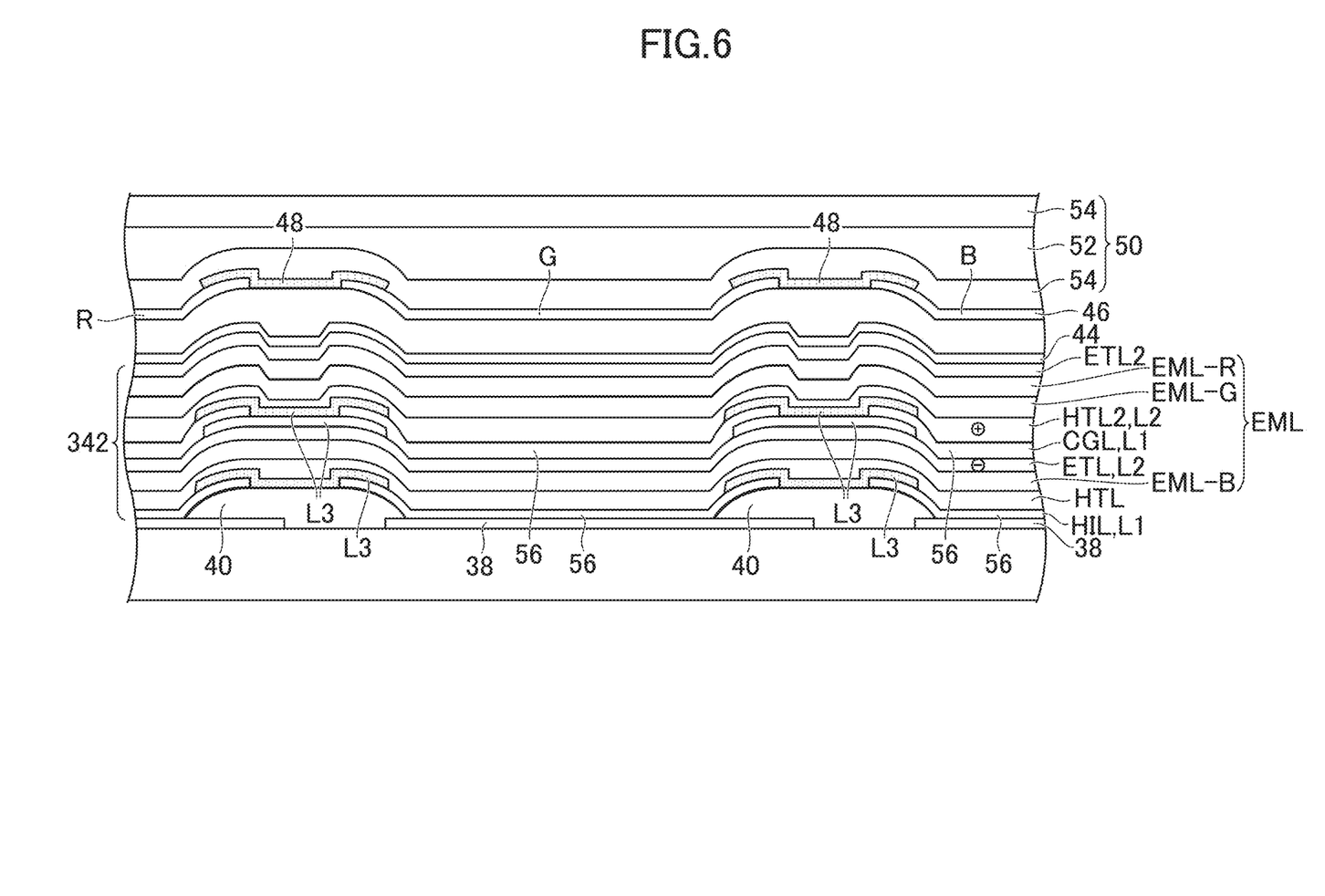
FIG. 6 is a cross-sectional view of a display device in a third embodiment.

FIG. 6 is a cross-sectional view of a display device in a third embodiment. In the present embodiment, the third layer L3 in the first embodiment on the hole injection layer HIL (first layer L1) is omitted.

The electroluminescent layer 342 includes a pair of second layers L2 (second hole transport layer HTL2, electron transport layer ETL) in contact with the first layer L1 (charge generation layer CGL) from above and below, respectively. The electroluminescent layer 342 includes a pair of third layers L3 in contact with the first layer L1 (charge generation layer CGL) from above and below, respectively. Each of the pair of third layers L3 is interposed between the first layer L1 (charge generation layer CGL) and a corresponding one of the pair of second layers L2 (second hole transport layer HTL2, electron transport layer ETL). The pair of third layers L3 are a hole block layer and an electron block layer. What is explained in the first embodiment is applicable hereto.

[Fourth Embodiment]

Figure 7:
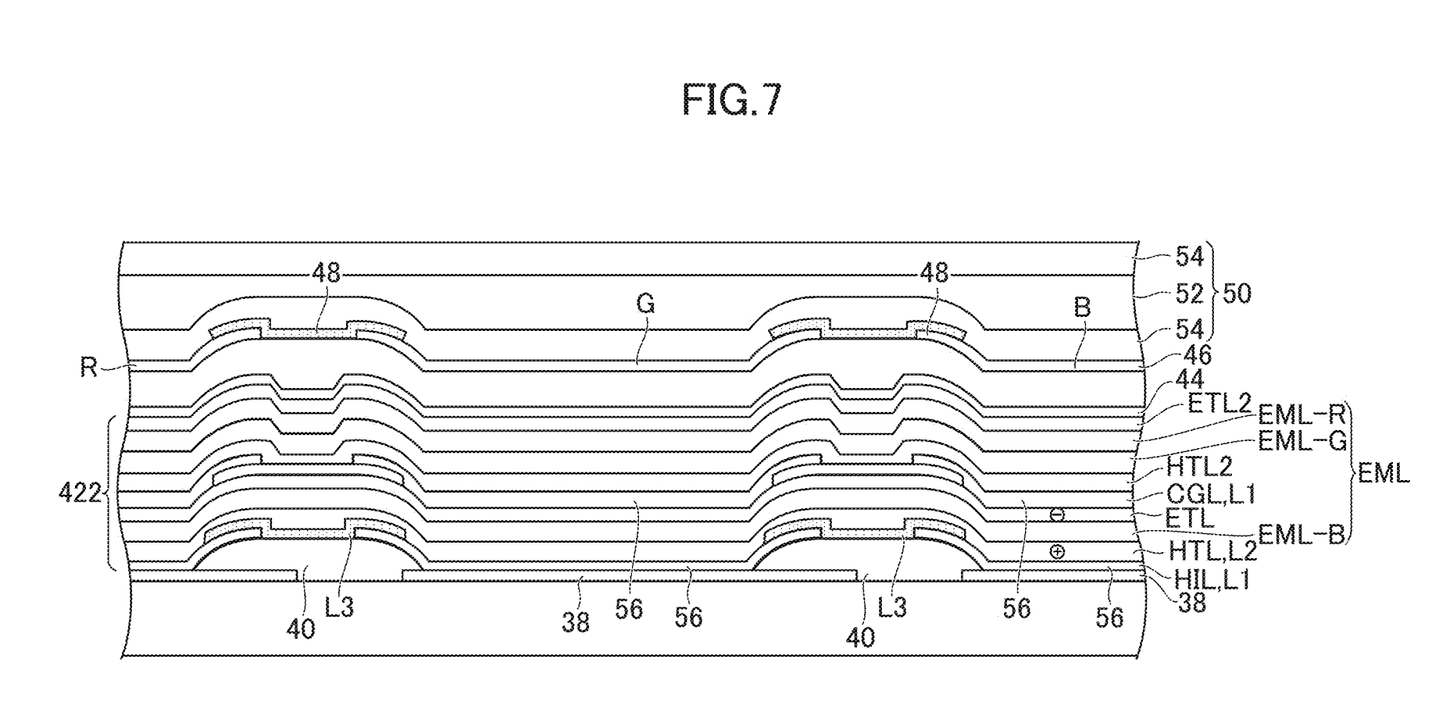
FIG. 7 is a cross-sectional view of a display device in a fourth embodiment.

FIG. 7 is a cross-sectional view of a display device in a fourth embodiment. In the present embodiment, the third layer L3 in the first embodiment on the charge generation layer CGL (first layer L1) is omitted. The charge generation layer CGL is made of a material with high transportability of electrons.

The electroluminescent layer 442 includes some first layers L1 (hole injection layer HIL, charge generation layer CGL) and some second layers L2 (hole transport layer HTL, electron transport layer ETL).

A third layer L3 is interposed between the hole injection layer HIL (first layer L1) and the hole transport layer HTL (second layer L2). This third layer L3 may be made of a material capable of blocking the holes that the hole injection layer HIL (first layer L1) has high transportability of, whereas the material may have high transportability of electrons.

Another third layer L3 is interposed between the charge generation layer CGL (first layer L1) and the electron transport layer ETL (second layer L2). This third layer L3 may be made of a material capable of blocking the electronics that the electron transport layer ETL (second layer L2) has high transportability of, whereas the material may have high transportability of holes. What is explained in the first embodiment is applicable hereto.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
    a plurality of pixel electrodes;
    an electroluminescent layer composed of multiple layers laminated with each other, the multiple layers including a light-emitting layer and a charge generation layer; and
    a counter electrode,
    wherein
    the multiple layers include a first layer composed of some sections separated from each other and overlapping with the plurality of pixel electrodes, a second layer in contact with the first layer and continuous over the plurality of pixel electrodes, and a third layer interposed between the first layer and the second layer, the third layer being in contact with the first layer and the second layer over an adjacent pair of the sections,
    at least the charge generation layer is the first layer,
    the second layer is adapted to inject or transport carriers, either electrons or holes, and
    the third layer is adapted to block the carriers injected or transported by the second layer.

2. The display device according to claim 1, wherein the third layer overlaps with respective ends of the adjacent pair of the sections.

3. The display device according to claim 1, wherein the second layer lies over and/or under the first layer.

4. The display device according to claim 1, wherein
    the light-emitting layer includes some light-emitting layers laminated with each other, and
    the charge generation layer is interposed between at least one layer of the light-emitting layers and another layer of the light-emitting layers.

5. The display device according to claim 1, wherein the light-emitting layers include two or more light-emitting layers overlapping with and in contact with each other.

6. The display device according to claim 1, further comprising a color filter layer.

7. The display device according to claim 1, further comprising a black matrix layer covering the third layer.

8. The display device according to claim 1, further comprising an insulating layer covering respective ends of the plurality of pixel electrodes,
    wherein the third layer is located only in a region overlapping with the insulating layer.

9. The display device according to claim 1, wherein
    the second layer includes a pair of second layers in contact with the first layer from above and below, respectively,
    the third layer includes a pair of third layers in contact with the first layer from above and below, respectively, and each of the pair of third layers is interposed between the first layer and a corresponding one of the pair of second layers.

10. The display device according to claim 9, wherein the pair of third layers are a hole block layer and an electron block layer.

11. The display device according to claim 1, wherein the first layer includes some first layers, the second layer includes some second layers, the third layer includes some third layers, and each of the third layers is interposed between a corresponding one of the first layers and a corresponding one of the second layers.

12. The display device according to claim 11, wherein each of the first layers is made from a material with high transportability of the carriers blocked by a corresponding one of the third layers.

13. The display device according to claim 11, wherein the second layers include a pair of second layers in contact with a corresponding one of the first layers from above and below, respectively, the third layers include a pair of third layers in contact with the corresponding one of the first layers from above and below, respectively, and each of the pair of third layers is interposed between the corresponding one of the first layers and a corresponding one of the pair of second layers.

* * * * *